METHOD OF MAKING SEMICONDUCTOR DEVICES

Filed Oct. 24, 1961 5 Sheets-Sheet 1

INVENTORS,
RICHARD E. QUINN &
JOSEPH H. McCUSKER
BY
W.S. Hill
AGENT

METHOD OF MAKING SEMICONDUCTOR DEVICES

Filed Oct. 24, 1961 5 Sheets-Sheet 2

INVENTORS
RICHARD E. QUINN &
JOSEPH H. McCUSKER
BY
W. S. Hill
AGENT

METHOD OF MAKING SEMICONDUCTOR DEVICES

Filed Oct. 24, 1961 5 Sheets-Sheet 3

INVENTORS
RICHARD E. QUINN &
JOSEPH H. McCUSKER
BY
W.S. Hill
AGENT

INVENTORS
RICHARD E. QUINN &
BY JOSEPH H. MCCUSKER

W. B. Hill
AGENT

INVENTORS
RICHARD E. QUINN &
BY JOSEPH H. McCUSKER
W.S. Hill
AGENT

United States Patent Office 3,179,542
Patented Apr. 20, 1965

3,179,542

METHOD OF MAKING SEMICONDUCTOR DEVICES

Richard E. Quinn, Hamilton Square, and Joseph H. McCusker, Princeton, N.J., assignors to Radio Corporation of America, a corporation of Delaware Filed Oct. 24, 1961, Ser. No. 147,238
10 Claims. (Cl. 148—177)

Figure 1A:
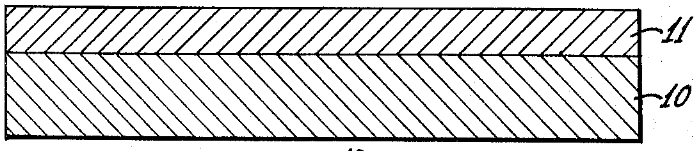

This invention relates to improved semiconductor devices, and improved methods of fabricating improved semiconductor devices.

In the semiconductor device art it is frequently necessary to make small electrical connections or contacts to crystalline semiconductor wafers. Various methods of fabricating such contacts are known to the art, but most of these methods are rather complex and time-consuming, and hence result in high scrap rates and high costs.

It is therefore an object of this invention to provide an improved mechanical and electrical connection to a semiconductor wafer.

Another object of the invention is to provide an improved ohmic contact to a semiconductor wafer.

Still another object is to provide an improved rectifying contact to a semiconductor wafer.

But another object is to provide an improved mechanical and electrical connection between an insulating plate and a semiconductor wafer.

Yet another object is to provide improved simple and rapid methods of fabricating improved semiconductor devices.

These and other objects and advantages of the invention are achieved by positioning a semiconductive crystalline wafer on a metallic plate, and utilizing an electron beam to drill a well transversely through the wafer and part of the plate. A portion of the metallic material of the plate immediately beneath the electron beam is melted by the energy of the beam. When the beam is turned off, the molten metallic material rises within the well, then cools and solidifies within the well in the wafer, provided the diameter of the well is sufficiently small. Preferably the diameter of the well should not exceed 3 mils. The solidified metallic plug or core within the well serves as a mechanical and electrical connection to the wafer. This connection may be either ohmic or rectifying to the wafer.

Figure 5A:
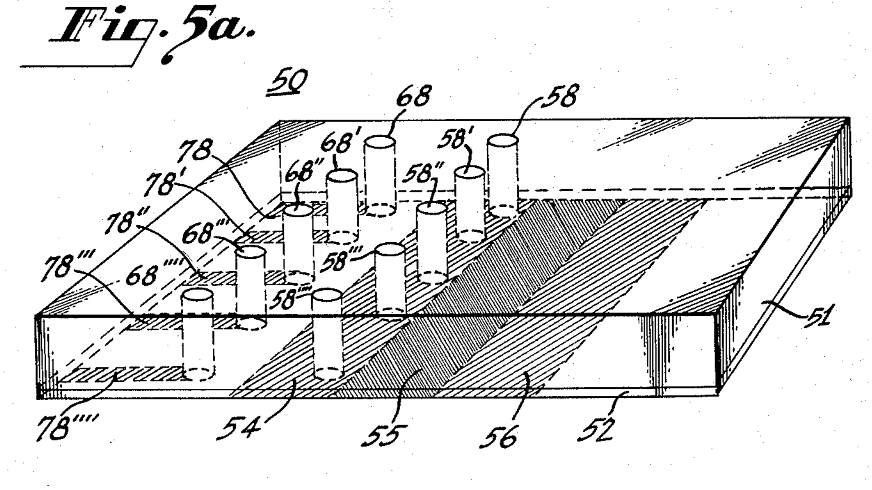
Figure 5B:
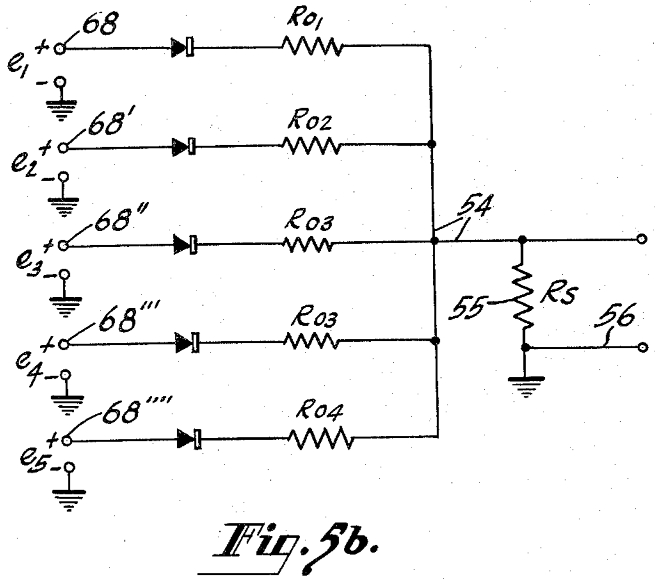

The invention and several embodiments thereof will be described in greater detail by reference to the drawing, in which:

FIGURES 1*a*–1*e* are cross-sectional views illustrating the fabrication of a semiconductor device according to one embodiment of the invention;

FIGURES 2*a*–2*e* are cross-sectional views illustrating successive steps in the fabrication of a semiconductor device according to another embodiment of the invention;

FIGURES 3*a*–3*h* are cross-sectional views of successive steps in the fabrication of a set of ohmic contacts and a set of rectifying contacts to the same semiconductive wafer;

FIGURES 4*a*–4*e* are cross-sectional views of successive steps in the fabrication of an electrical circuit element according to another embodiment of the invention;

FIGURE 5*a* is a schematic view of an integrated solid state electronic device according to the invention; and, FIGURE 5*b* is the equivalent circuit of the device of FIGURE 5*a*.

Similar elements have been designated by similar reference characters throughout the drawing.

It will be understood that the following examples are by way of illustrataion only, and not limitation, since various modifications may be made without departing from the spirit and scope of the invention.

*Example I*

A wafer of crystalline semiconductive material 11 is positioned on a metallic plate 10 so that their adjacent major faces are parallel and in contact, as illustrated in FIGURE 1*a*. Preferably both plate 10 and wafer 11 have parallel and flat opposing major faces. Wafer 11 may be either monocrystalline or polycrystalline, and is of a thickness suitable for semiconductor device fabrication, for example about 3 to 20 mils thick. The exact thickness of wafer 11 is not critical. Wafer 11 may be normally doped so as to be either of N-type or P-type conductivity. Alternatively, wafer 11 may be very lightly doped so as to be intrinsic, or very heavily doped so as to be degenerate. The semiconductive material utilized may consist of elemental semiconductors such as germanium, silicon, germanium-silicon alloys, and the like, or compound semiconductors such as the phosphides, arsenides and antimonides of aluminum, gallium and indium, or the sulfides, selenides and tellurides of zinc and cadmium. In this example, wafer 11 consists of monocrystalline N-type germanium, and is about five mils thick. Metallic plate 10 may be a pure metal or an alloy, and consists of or contains a substance capable of imparting a particular type conductivity to the semiconductive wafer 11. If an ohmic contact to a given conductivity type wafer 11 is desired, then the metallic plate 10 is selected so as to include a substance capable of imparting the said given conductivity type to the wafer. If a rectifying contact to a given conductivity type wafer is desired, then the metallic plate is selected so as to include a substance capable of imparting opposite conductivity type to the wafer. Plate 10 may suitably be 30 to 100 mils thick. The exact thickness of metallic plate 10 is not critical in the practice of the invention. In this example, plate 10 is about 30 mils thick and consists of lead-tin solder containing about 1 weight percent of a material such as antimony which is a donor in germanium.

Figure 1B:
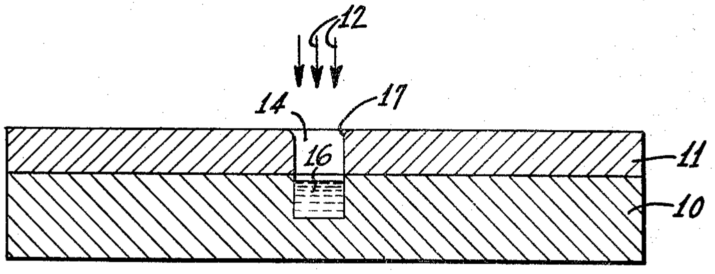

The assemblage of plate 10 and wafer 11 is placed in the chamber of an electron beam milling machine (not shown), and the chamber is evacuated to a pressure sufficiently low to permit efficient operation of the electron beam. A residual pressure of about $10^{-5}$ mm. Hg has been found satisfactory. An electron beam 12 is then directed transversely against the desired portion of semiconductor wafer 11, as illustrated in FIGURE 1*b*. For most rapid drilling and most uniform results, the electron beam 12 is preferably substantially perpendicular to the major faces of wafer 11 and plate 10. The electron beam 12 is preferably pulsed for better control of the process, and the maximum diameter of the beam is preferably less than about 3 mils as it strikes the wafer 11 and plate 10. The minimum diameter of the beam is determined by the resolution of the particular machine utilized, and in presently available electron beam milling machines the minimum diameter of the beam is about 0.5 mil. The average energy of the electrons in beam 12 is preferably not less than about $10^5$ electron volts. The peak beam current is adjusted to the minimum value necessary to vaporize the wafer material. The upper limit of the electron energy is set by the power of the machines available, and also by the fact that the drilling efficiency of the machine tends to decrease as the average energy of the beam electrons increases above about $2\times10^5$ electron-volts. In this example, the electron beam 12 is about 1 mil in diameter, has an average electron energy of about $10^5$ electron-volts, and is pulsed. The electron beam pulses are suitably about 5 to 50 microseconds in duration. It has been found that satisfactory results are obtained if the interval between pulses exceeds 50 milliseconds. In this example, the interval between the beam pulses is about 100 milliseconds, and the duration of each pulse is about 5 microseonds.

For the particular materials and dimensions and pulse durations and beam energy of this example, about 5 pulses are sufficient to drill a hole or well 14 completely through the thickness of semiconductive wafer 11 and partly into metallic plate 12. As shown in FIGURE 1*b*, the sides of well 14 are relatively straight, so that well 14 is of fairly uniform diameter, but the lip 17 of well 14 is generally somewhat wider than the well itself. For other materials and thickness dimensions and pulse durations and electron beam energies, a different number of pulses will be required, which is best determined by experiment. The number of pulses required can be reduced by increasing the duration of each pulse, or by increasing the average energy of the electrons in the beam by increasing the current density of the beam. The energy of the electron beam 12 is sufficient to completely vaporize that portion of wafer 11 which was immediately beneath the electron beam 12. The diameter of well 14 is about one mil in this example. The beam energy is also sufficient to melt a portion 16 of the metallic plate immediately beneath the beam.

The circumstance that the metallic plate material is melted by the beam but is not vaporized and is still present, while the semiconductive wafer material is completely vaporized and removed, may be explained by considering the thermal balance involved in electron beam drilling. The energy supplied by the beam must be sufficient to balance the heat required to raise the temperature of the body being drilled, plus the heat of fusion of the portion of the body which is melted, plus the heat of evaporation of the portion of the body evaporated, plus the heat loss by conduction away from the location of the beam, plus the heat loss by radiation from the body. For a more complete discussion of the characteristics and problems of electron beam drilling, see for example, Proceedings of the Third Symposium on Electron Beam Technology, Alloyd Electronics Corporation, Cambridge 42, Mass., 1961. In this case, the difference in thermal conductivity of the metallic plate as compared to the semiconductive wafer may account for the fact that the plate material beneath the beam 12 is melted, while the semiconductive material beneath the electron beam is evaporated. It will be understood, however, that continued application of the electron beam would result in drilling the well or hole 14 completely through the metallic plate 10, since the difference in behavior of the wafer and the plate may be regarded as a difference in the rate at which they are attacked by the electron beam.

Figure 1C:
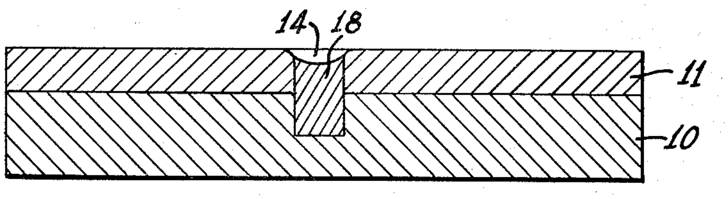

When the electron beam 12 is turned off at the completion of the five-pulse cycle described above, the molten material 16 rises in the well 14 and cools rapidly to room temperature so as to solidify as a core or plug 18 within well 14, as illustrated in FIGURE 1*c*. The core or plug 18 makes a good mechanical and electrical connection to wafer 11. Since in this example the semiconductive wafer is N-type and the metal plate contains a donor, the contact between the plug and the wafer is ohmic in character.

If the molten metallic material is capable of wetting the semiconductive wafer, the rise of the molten material 16 in well 14 may be partly due to capillary action. It is also noted that the energy density of the beam, which is about $10^8$ watts per cm.$^2$, is sufficient to keep the molten portion 16 in violent churning motion as if boiling, so that the rise of the molten material 16 in well 14 may be due to the churning effect. It is probable that some such effect is present, as it has been observed that the core or plug 18 sometimes extends as a spike above the well 14, and this cannot be due to capillary action. Since the total amount of the metallic material present has not been increased, the increase in volume of the metallic plate represented by that portion of the plug 18 which is in wafer 11 must be compensated either by a bubble or hole inside plate 10, or by the entire plug 18 consisting of metallic material which is porous and of lesser density than metallic plate 10. There are several reasons for believing that plug 18 is porous and of lesser density than plate 10. For example, etching studies have indicated that the rate of etching through plug 18 is greater than the rate of etching through plate 10.

It is believed that one reason why plug 18 makes a good electric contact to wafer 11 is that the removal of a portion of wafer 11 is accomplished in a vacuum, so that a fresh, clean, uncontaminated surface of wafer 11 within well 14 is thus obtained. When the electron beam 12 is turned off, the molten plate material 16 rushes up and uniformly wets the fresh, clean surface of well 14 within wafer 11, thereby insuring a good contact. Another desirable feature of the contact thus fabricated is that the area of the contact is a cylinder, and not merely the area of a circle, as in other semiconductor contacts which are made to the surface of a semiconductive wafer. Since the contact is thus made over a large area, the resistance of the contact is decreased.

If desired, wafer 11 may now be removed from plate 10 by means of a razor blade. However, if many such contacts have been made between the wafer and the plate, such separation tends to become difficult, and techniques described below may be utilized instead.

Figure 1D:
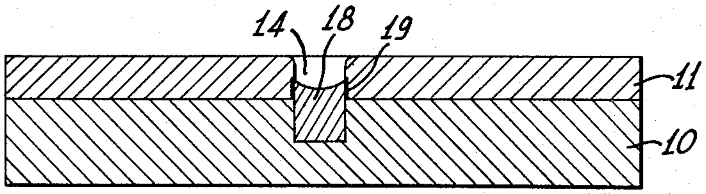
Figure 1E:
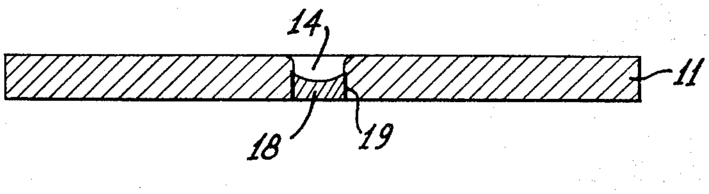

For some purposes it may be desirable to improve the quality of the connection between plug 18 and wafer 11. Provided the plate and the wafer form a eutectic having a melting point lower than that of either the wafer or the plate separately, this may be accomplished by heating the assemblage of wafer 11 and plate 10 to a temperature sufficient to induce alloying between the plug and the wafer but below the melting point of wafer 11 and also below the melting point of plate 10. As a result, alloying takes place between the periphery of plug 18 and wafer 11. An alloy front 19 is thus formed, as illustrated in FIGURE 1*d*. It is also noted that the thickness of plug 18 in well 14 decreases as a result of this heating step. This can be explained as due to the sintering effect of the heating step on porous material, and hence is another indication that plug 18 is porous and less dense than plate 10. Alternatively, wafer 11 may be removed from plate 10 before the step of heating the wafer to cause the formation of alloy front 19 between the plug or core 18 and the wafer as illustrated in FIGURE 1*e*. Such removal is advantageous if alloying is desired and the wafer must be heated to a temperature above the melting point of the plate but below the melting point of the wafer in order to induce alloying.

*Example II*

In this example, wafer 11 consists of monocrystalline N-type silicon and is about 5 mils thick, while plate 10 consists of 99 weight percent tin–1 weight percent arsenic alloy about 40 mils thick. Since silicon is more refractory than germanium, the duration of each beam pulse is increased to about 20 microseconds. The pulses are spaced at intervals of 100 milliseconds, as in the previous example. Under these conditions, it has been found that about 9 pulses are required to drill a well 14 through the silicon wafer and melt a portion of the underlying tin plate. When the electron beam is turned off, a porous plug or core of tin-arsenic alloy is formed within the well 14. The tin-arsenic plug 18 makes an excellent mechanical and ohmic electrical connection to the N-type silicon wafer 11. As described above, the quality of the contact between plug 18 and semiconductor wafer 11 may be improved by separating the wafer from the plate and heating the wafer alone to a temperature below the melting point of semiconductor wafer 11. Heating the silicon wafer to about 500° C. for 2 minutes is sufficient in this example to induce some alloying between the plug and the wafer.

*Example III*

In this example, wafer 11 consists of P-type germanium, and plate 10 consists of an alloy of indium with 0.5 weight percent gallium. For a germanium wafer 5 mils thick, the electron beam pulses are set for a duration of 5 microseconds, with an interval between pulses of about 100 milliseconds. Under these conditions, a series of about 5 pulses from an electron beam having an average electron energy of about $10^5$ electron-volts is sufficient to drill through the germanium wafer and melt a portion of the indium-gallium alloy plate. Thereafter the electron beam is turned off, and a plug 18 of indium-germanium alloy is formed within well 14 in wafer 11. The indium-gallium plug 18 forms an excellent mechanical and ohmic connection to P-type wafer 11. As in Example I, the quality of the connection may be improved by heating the wafer to a temperature below the melting point of the wafer so as to induce alloying between plug 18 and wafer 11.

It will be appreciated that for the fabrication of an ohmic contact to a wafer of N-type semiconductive material, the metallic plate should contain a substance which is a donor in the wafer. For an ohmic contact to a wafer of P-type material, the metallic plate should include a substance which is an acceptor in the wafer.

*Example IV*

In this example, semiconductor wafer 11 consists of P-type silicon, and plate 10 consists of aluminum. As in Example II, when the average energy of the beam electrons is about $10^5$ electron volts and the duration of each beam pulse is about 20 microseconds, a series of about 9 pulses are sufficient to drill a well through a 5 mil thickness of silicon and partly into the supporting aluminum plate. The aluminum plug 18 thus formed within well 14 makes an ohmic contact to the P-type silicon wafer 11. Since silicon and aluminum form a eutectic which melts at 577° C., while aluminum melts at 660° C., the wafer and plate in this example may be heated to 600° C. for ten minutes to induce alloying of aluminum plug 18 to silicon wafer 11. Alternatively, the semiconductive wafer may be removed from the aluminum plate before the wafer is heated.

While the fabrication of ohmic connections to semiconductive wafers has been described above, the method of the invention may also be utilized to fabricate rectifying contacts to semiconductive wafers, as in the following six examples. When rectifying contacts are made, the semiconductive wafer is subsequently removed from the metallic plate to prevent shorting across the junction.

*Example V*

In this example, semiconductor wafer 11 consists of N-type germanium as in Example I, but metallic plate 10 consists of an alloy of indium with 0.5 weight percent gallium. The steps of positioning wafer 11 on plate 10, and utilizing an electron beam to drill a well transversely through the wafer and partly into the plate so as to melt a portion of the plate, are similar to that described in Example I and illustrated in FIGURE 1*b*. The exact number of pulses used and the duration of each pulse may be varied, depending on the thickness and nature of the materials. The interval between pulses is preferably greater than 50 milliseconds. A pulse interval of about 100 milliseconds is satisfactory. When the electron beam is turned off, the well 14 within wafer 11 fills with the molten plate material. The molten material cools rapidly and freezes to form a plug 18 of the plate material within the well, as illustrated in FIGURE 1*c*. Since plug 18 now consists of indium and gallium, which are acceptors in germanium, it forms a rectifying contact to the N-type germanium wafer 11. Wafer 11 is now removed from plate 10. The rectifying contact can be improved by heating the wafer to a temperature below the melting point of the germanium. In this example, heating to a temperature of 525° C. for three minutes is sufficient to induce alloying of plug 18 to wafer 11. The alloy front 19 thus formed is around the periphery of plug 18, as illustrated in FIGURE 1*e*. A rectifying junction is formed at the interface between alloy front 19 and the semiconductive wafer 11.

*Example VI*

In this example semiconductor wafer 11 consists of N-type silicon, as in Example II, but plate 10 consists of aluminum. The steps of positioning wafer 11 on plate 10, and utilizing a pulsed electron beam to drill a well 14 transversely through the wafer and partly into the plate so as to melt a portion of the plate are similar to those described above. The number and duration of electron beam pulses are determined by experiment for the particular dimensions and materials utilized, as described above. When the silicon wafer is 5 mils thick, 9 pulses of 20 microseconds duration may be utilized, with an interval between pulses of about 100 milliseconds. In this example, an aluminum plug 18 is formed within the well 14 in wafer 11. Wafer 11 is then removed from plate 10. For best results in the fabrication of rectifying contacts, the wafer 11 is subsequently heated to a temperature below the melting point of silicon. In this example, heating to 650° C. for 10 minutes is sufficient to cause some alloying of the aluminum plug to the wafer, and thus form a P–N junction at or immediately in front of the alloy front 19.

*Example VII*

In this example, semiconductor wafer 11 consists of P-type germanium, as in Example III, but plate 10 consists of a lead-antimony alloy containing about 1 weight percent antimony. The method of utilizing a pulsed electron beam to drill a well 14 transversely through the germanium wafer and partly into the plate so as to melt a portion of the plate is similar to that described above in Examples I, III and V. The semiconductive wafer is then removed from the plate. The porous plug 18 or core of lead-antimony alloy thus formed within the well constitutes a rectifying connection to the wafer, which is subsequently heated to about 500° C. for about five minutes to induce alloying of the plug to the wafer. Since a P-N junction is fabricated at or immediately adjacent the alloy front 19, a good rectifying contact to the wafer is thus formed by the lead-antimony plug.

*Example VIII*

In this example, wafer 11 consists of P-type silicon, as in Example IV, but plate 10 consists of lead-arsenic alloy. A pulsed electron beam is utilized as described above in Examples II, IV and VI to drill a well 14 transversely through the thickness of the silicon wafer and partly into the metallic plate so as to melt a portion of the plate. The wafer 11 is then removed from plate 10. The wafer and the porous plug 18 of the lead-arsenic alloy thus formed within well 14 in the wafer is subsequently heated to about 500° C. for about two minutes to induce alloying of the plug to the wafer. As a P-N junction is fabricated at or immediately adjacent the alloy front 19, a rectifying contact to the silicon wafer is thus formed by the lead-arsenic plug.

*Example IX*

In this example, wafer 11 consists of P-type gallium arsenide, and plate 10 consists of an alloy or solid solution of tin and tellurium containing about 40 weight percent tellurium. A pulsed electron beam is utilized as described above to drill a well through the thickness of the gallium wafer and partly into the tin-tellurium plate and melt a portion of the plate. The optimum number, duration, and interval between pulses is easily determined by test on the particular materials and dimensions utilized. A porous plug or core 18 of tin-tellurium alloy is formed within well 14 in wafer 11. Wafer 11 is subsequently removed from plate 10, and heated to about 800° C. for about 10 minutes to induce alloying of the plug to the wafer. Since tellurium is a donor in gallium arsenide, the contact between the tin-tellurium plug thus formed to the P-type gallium arsenide wafer is rectifying in character.

*Example X*

In this example, wafer 11 consists of N-type indium phosphide and metallic plate 10 consists of zinc. A pulsed electron beam is utilized as described above in Example IX to form a porous zinc plug 16 within a well 14 in the indium phosphide wafer. The wafer is subsequently removed from the plate and heated to induce alloying of the plug to the wafer. Since zinc is an acceptor in indium phosphide, the contact between the plug thus formed and the N-type indium phosphide wafer is rectifying in character.

It has been found that although the semiconductive wafer and the metallic plate are readily separated by a razor blade when only one contact is formed to the wafer by the methods described above, separation of the wafer and the plate becomes more difficult when a plurality of contacts are formed to the wafer. The difficulty in separating the wafer and plate increases with the number of contacts, since, as mentioned above, the contacts thus formed are also good mechanical contacts between the plate and the wafer. The method of the invention may be modified as described in the following example for greater ease in separating the semiconductive wafer from the metallic plate.

*Example XI*

Figure 2A:
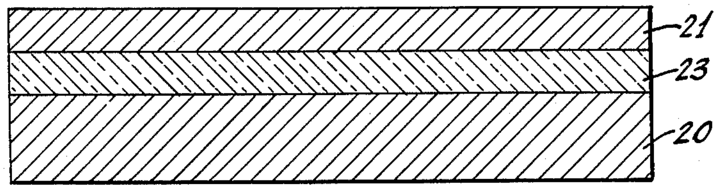
Figure 2B:
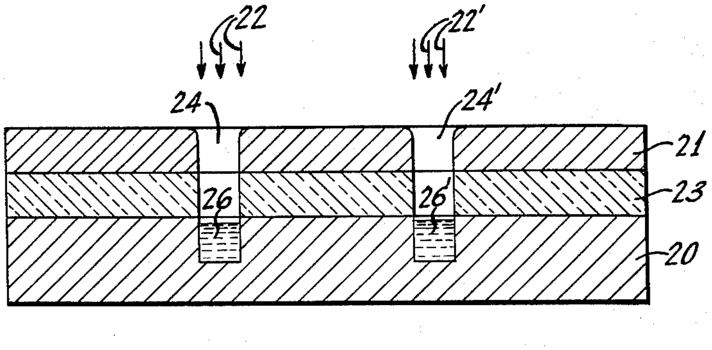
Figure 2C:
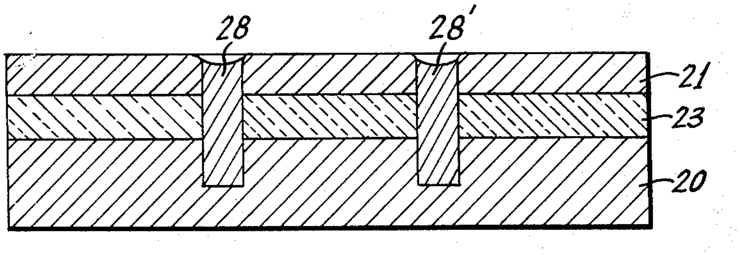

A thin insulating sheet 23 is positioned on one face of a metallic plate 20, as illustrated in FIGURE 2*a*. Sheet 23 may, for example, consist of mica or ceramic or the like, or of an insulating resin or plastic, and is preferably less than 3 mils thick. In this example sheet 23 consists of mica and is 3 mils thick. A semiconductive crystalline wafer 21 is positioned on insulating sheet 23. Preferably plate 20 and wafer 21 have parallel and flat opposing major faces. In this example wafer 21 consists of P-type polycrystalline germanium and plate 20 consists of indium. A pulsed electron beam 22 is utilized to drill a well 24 at a predetermined location transversely through wafer 21 and through insulating sheet 23 and partly into plate 20, as illustrated in FIGURE 2*b*. The energy of the electron beam 22 is sufficient to melt and boil the portion 26 of the indium plate immediately beneath the beam. When the electron beam 22 is turned off, the molten indium 26 rises within well 24 in wafer 21, cools rapidly, and solidifies as a porous plug 28 within well 24, as shown in FIGURE 2*c*. Plug 28 forms a good mechanical and ohmic electrical connection to wafer 21.

Figure 2D:
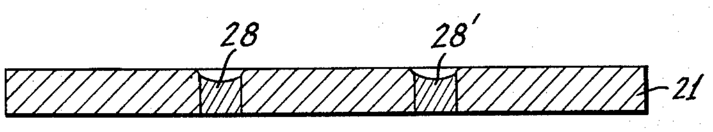
Figure 2E:
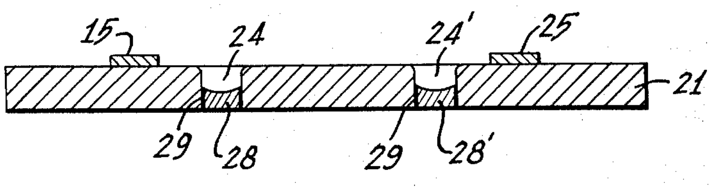

The electron beam 22 is now moved to another predetermined location, and a second well 24′ is drilled transversely through wafer 21 and sheet 23, and partly into plate 20. Alternatively, as illustrated in FIGURE 2*b*, a milling machine with a second electron beam 22′ may be used to drill both wells simultaneously. As before, a molten portion 26′ of the plate material rises in well 24′ when the beam is turned off, and solidifies as a porous plug 28′ within well 24′. Porous plug 24′ forms another ohmic contact wafer 21. Although only two wells and two electrical connections to wafer 21 have been illustrated in FIGURES 2*b*–2*e*, it will be understood that as many contacts may be made as desired. However, for the best results, the contacts should be spaced at least 50 mils apart when many contacts are made to the same wafer. If only two contacts are made, or clusters of only two contacts in each cluster, the individual contacts in each cluster may be spaced only five mils apart. Thereafter insulating sheet 23 facilitates the separation of wafer 21 from plate 20, since a shearing or torsion force may now be conveniently applied between the plate and the wafer, or the metal plate may be etched or abraded away without injury to the semiconductive wafer. Plugs 28 and 28′ fill wells 24 and 24′ respectively almost completely, as illustrated in FIGURE 2*d*, and form ohmic contacts to the wafer. If desired, the quality of the contacts may be improved by subsequently heating the wafer to induce alloying of the plugs to the wafer. Alloy fronts 29 and 29′ are thus formed around plugs 28 and 28′ respectively, as illustrated in FIGURE 2*e*.

One advantage of this embodiment is that since the plate 10 has been removed, the heating step to alloy the plugs to the wafer may be performed at a temperature above the melting point of the plate, although still below the melting point of the semiconductive wafer. As the wells utilized are small in diameter, being in fact less than 3 mils in diameter, capillary forces are sufficient to keep the plug materials within the wells even when the wafer is heated to a temperature above the melting point of the plugs.

*Example XII*

In this example, wafer 21 consists of N-type monocrystalline germanium, plate 20 consists of aluminum, and sheet 23 (FIGURE 2*a*) consists of an insulating plastic such as cellophane or the like. Sheet 23 is about 5 mills thick in this example. A plurality of wells such as 24 and 24′ (FIGURE 2*b*) are formed in wafer 21 by a pulsed electron beam as described in Example XI above. A porous aluminum plug 28 and 28′ forms in wells 24 and 24′ respectively, as illustrated in FIGURE 2*c*. Thereafter the wafer 21 is readily separated from the plate 20. The separate wafer 21 with a plurality of electrical connections thereto is illustrated in FIGURE 2*d*. Since aluminum is an acceptor in germanium, contacts 28 and 28′ are rectifying in character. The quality of the contacts may be improved considerably by heating the wafer 21 sufficiently to induce alloying of the plugs 28 and 28′ to the wafer. As illustrated in FIGURE 2*e*, alloy fronts 29 and 29′ are thus formed around the periphery of plugs 28 and 28′ respectively. Immediately at or adjacent the alloy fronts 29 and 29′, P-N junctions are formed. The thickness of plugs 28 and 28′ decreases as a result of the heating step, as shown in FIGURE 2*e*.

If desired an assemblage of rectifying diodes may be formed within wafer 21. For example, electrode pellets 15 and 25, which consist of or contain material that induces the same conductivity type as the wafer, may now be alloyed to wafer 21 adjacent wells 24 and 24′ respectively. In this example electrode pellets 15 and 25 consist of tin-arsenic alloy. Since arsenic is a donor in germanium, pellets 15 and 25 form ohmic contacts to the N-type wafer 21 of this example. Subsequently, lead wires (not shown) may be connected respectively, for example by soldering, to ohmic electrode 15 and rectifying plug 28 so that the rectifying properties between electrodes 15 and 28 may be utilized. Similarly, rectifying action may be obtained between electrodes 25 and 28′. Conductive paths may be formed on an insulating layer on one or both faces of wafer 11 so as to interconnect the array of diodes in a desired matrix. Such conductive paths may, for example, be formed by depositing a conductive material such as silver or the like on predetermined areas of wafer 11.

The method last described above may be modified by first making one or more contacts to a given conductivity type semiconductive wafer utilizing a first metallic plate which induces one conductivity type in the wafer, removing the wafer from the first plate, positioning the wafer on a second metallic plate which induces another conductivity type in the wafer, and forming one or more contacts to the wafer utilizing the second plate. It will be appreciated that two sets of contacts may thus be fabricated on the same wafer, one set being ohmic contacts and the other set being rectifying contacts, as described in the following example.

*Example XIII*

Figure 3A:
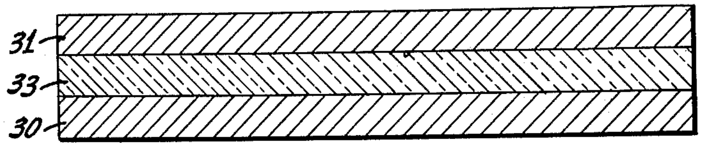
Figure 3B:
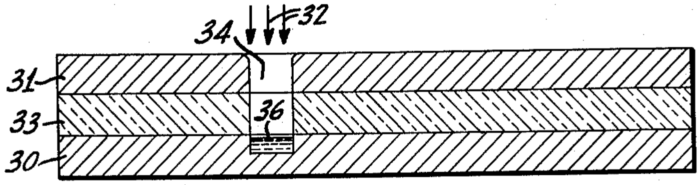
Figure 3C:
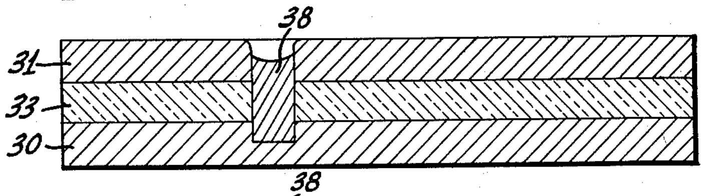

In this example, a thin insulating sheet 33 is positioned upon a metallic plate 30, and a given conductivity type monocrystalline semiconductive wafer 31 is positioned on sheet 33, as illustrated in FIGURE 3*a*. The wafer 31 and the insulating sheet 33 are each 10 mils thick in this example, while the metallic plate 30 is 50 mils thick. Preferably they all have parallel and flat opposing major faces. In this example, wafer 31 is P-type, and plate 30 consists of or contains a material which is an acceptor in the particular semiconductor utilized for wafer 31. A pulsed electron beam 32 is utilized to form a first set of wells icluding at least one well 34 transversely through the thickness of wafer 31 and sheet 33, and partly through metallic plate 30, as illustrated in FIGURE 3*b*. The electron beam melts a portion 36 of the metallic plate, as described in Examples XI and XII. Plugs such as plug 38 (FIGURE 3*c*) of the first plate material are thus formed within each well of the first set, such as well 34. In this example, since wafer 31 is P-type and each plug 38 contains acceptor material, the first set of plugs such as plug 38 constitute ohmic contacts to wafer 31. Wafer 31 is now removed from the first metallic plate 30. Such removal is facilitated by the presence of the insulating sheet 33, which prevents sticking between the plate and the wafer.

Figure 3D:
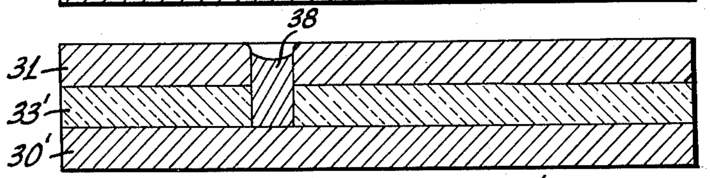

A second flat insulating sheet 33′ is positioned on a second flat metallic plate 30′ and the semiconductive wafer 31 is positioned on the second insulating sheet 33′ opposite to the second metallic plate 30′, as illustrated in FIGURE 3*d*. The second plate 30′ in this example consists of or contains a material which is a donor in the particular semiconductor utilized by the wafer.

Figure 3E:
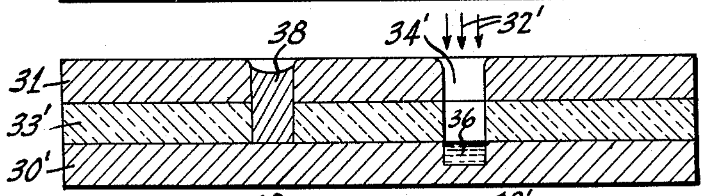
Figure 3F:
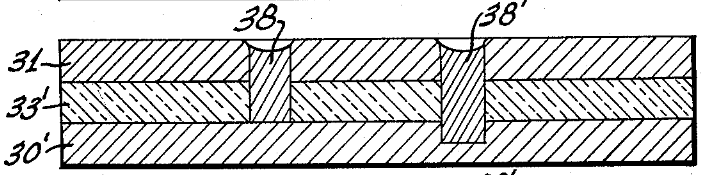
Figure 3G:
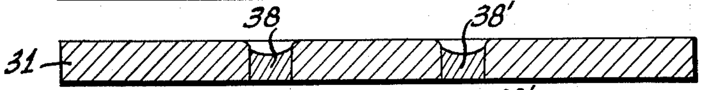
Figure 3H:
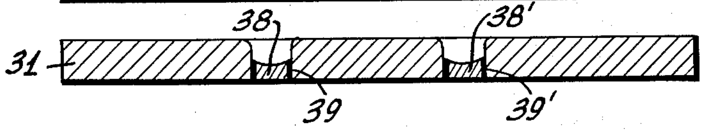

A pulsed electron beam 32′ is now employed to form a second set of wells including at least one well 34′ transversely through the thickness of the wafer 31 and the second insulating sheet 33′, and partly into the second metallic plate 30′, as shown in FIGURE 3*e*. Plugs such as plug 38′ consisting of the material of the second plate are thus formed in the second set of wells or holes such as well 34′ in the wafer, as illustrated in FIGURE 3*f*. Since, in this example, the wafer is P-type and the second sheet of plugs contain donor material, the second set of contacts such as plug 38′ are rectifying in character. As mentioned above, all of the wells are preferably not more than 3 mils in diameter, and are spaced at least 5 mils apart. The wafer 31 can now be removed from the second plate 30′ and the second insulating sheet 33′, as illustrated in FIGURE 3*g*. If desired, the wafer may now be heated so as to improve the quality of all the contacts by alloying the plugs to the wafers. On heating wafer 31 to a temperature below the melting point of the wafer but above the melting point of the plugs, alloy fronts 39 and 39′ are formed respectively around the first set of plugs 38 and the second set of plugs 38′ in the wafer as illustrated in FIGURE 3*h*. Alternatively, the heating step may be performed only after the first sheet of contacts has been fabricated, so that only the first sheet of contacts is alloyed to the wafer.

*Example XIV*

The method of the invention may also be utilized to form contacts between a semiconductor wafer and a printed circuit on an insulating support, as described in this example.

Figure 4A:
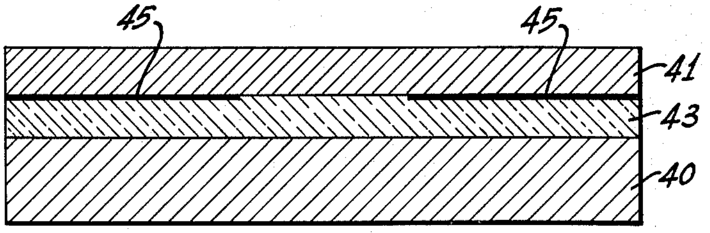

In this example an insulating support or plate 43 (FIGURE 4*a*) is positioned on a flat metallic plate 40. Support 43 may for example consist of a flat ceramic wafer bearing metallized portions 45 on at least one major face. The metallized ceramic wafers may be of the type utilized as circuit elements and known as micromodules. For an explanation of the use of metallized ceramic wafers as micromodules, see H. Kihn, "Some Recent Developments in Integrated Electronics," Electrical Engineering, July 1961. Alternatively, insulating support 43 may consist of an insulating resin or plastic having an etched copper printed circuit 45 on at least one major face. A flat monocrystalline given conductivity type wafer 41 is positioned on support 43 so that the semiconductive wafer, the insulating support, and the metallic plate are all parallel, and the support 43 is sandwiched between the semiconductive wafer 41 and the metallic plate 40, as illustrated in FIGURE 4*a*. Preferably semiconductive wafer 41 and insulating support 43 and metallic plate 40 all have flat and parallel opposing major faces. The semiconductive wafer 41 and the insulating support 43 are preferably relatively thin, and in this example each does not exceed 15 mils in thickness. The metallic plate 40 contains a substance capable of inducing a given conductivity type in the semiconductive wafer 41, i.e., a substance which is either an acceptor or a donor in the semiconductive wafer. In this example, support 43 is a phenolic base plastic bearing an etched copper printed circuit 45 on one major face thereof.

Figure 4B:
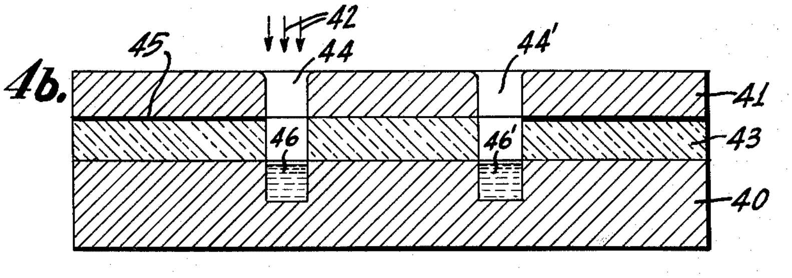

A pulsed electron beam 42 is now utilized to drill at least one well 44 at a predetermined location transversely through the thickness of semiconductive wafer 41, and through insulating support 43 and partly into metallic plate 40, as illustrated in FIGURE 4*b*. Well 44 is preferably not more than about 3 mils in diameter. A portion 46 of the metallic plate 40 immediately beneath the electron beam 42 is melted by the beam. The number of electron beam pulses utilized and the duration of each pulse are determined by experiment for the particular materials and dimensions utilized.

Figure 4C:
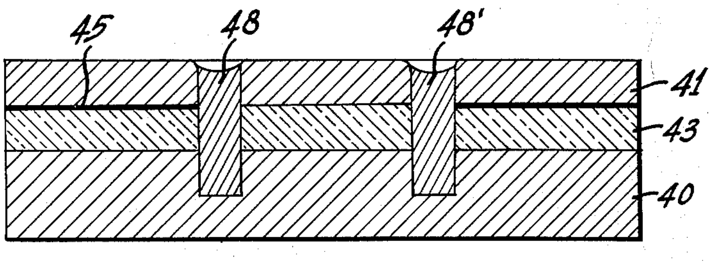

The electron beam 42 is then turned off. The molten plate material 46 rises in well 44, cools rapidly, and solidifies as a porous metallic plug 48. Plug 48 substantially fills the well 44, as illustrated in FIGURE 4*c*, and forms an electrical contact to the wafer 41. In this example, the location of well 44 has been selected so that plug 48 also forms an electrical contact to a predetermined portion of the printed circuit 45. If desired, a plurality of such contacts to the printed circuit 45 may be formed. In this example, a second well 44′ is drilled by a pulsed electron beam at a second predetermined location transversely through the thickness of semiconductive wafer 41 and insulated support 43 and partly into metallic plate 40, as illustrated in FIGURE 4*b*. The second well 44′ may be drilled either simultaneously with or subsequently to the first well 44. A second porous metallic plug 48′ is thus formed which makes an electrical contact to another portion of the printed circuit 45, as shown in FIGURE 4*c*. If many such contacts are made to the same wafer, they preferably are spaced at least 50 mils apart.

Figure 4D:
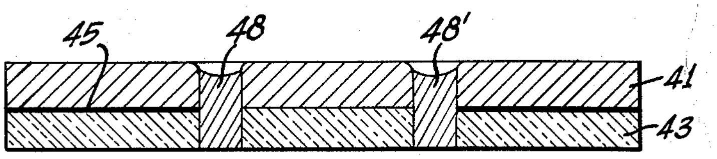

The metallic plate 40 is now removed from insulating support 43 without disturbing semiconductive wafer 41. This may be accomplished by means of a razor blade gently inserted between plate 40 and support 43 as a wedge. The plugs break off and remain in their respective openings. Alternatively, the sandwich arrangement illustrated in FIGURE 4*a* may include a thin insulating sheet (not shown) of a material such as mica or cellophane between support 43 and metallic plate 40, to insure easy separation of plate 40 from support 43 after the desired number of contacts have been formed. The assemblage of semiconductive wafer 41 and insulating support 43 remaining after metallic plate 40 has been removed is illustrated in FIGURE 4*d*. The plurality of metallic plugs such as 48 and 48′ serve also as mechanical contacts between semiconductive wafer 41 and insulating support 43. In this example the metallic plate 40 contains a substance which induces opposite conductivity in the given conductivity type semiconductive wafer 41, hence rectifying contacts are formed between the semiconductive wafer and the plurality of metallic plugs such as 48 and 48′.

Figure 4E:
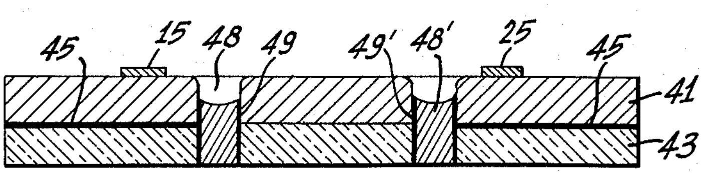

The assemblage of wafer 41 and insulating support 43 is now heated to induce alloying between semiconductive wafer 41 and the metallic plugs 48 and 48′. As a result of the heating step, alloy fronts 49 and 49′ are formed around plugs 48 and 48′ respectively, as illustrated in FIGURE 4e. PN junctions are formed in wafer 41 at or immediately adjacent the alloy fronts 49 and 49′. As in the previous example, the thickness of the porous plugs 48 and 48′ tends to decrease as a result of this heating step. During the same heating step, or if desired in a subsequent heating step, electrode pellets 15 and 25 (FIGURE 4e) may be alloyed to wafer 41 adjacent plugs 48 and 48′ respectively. Electrode pellets 15 and 25 consist of a material which makes an ohmic contact to wafer 41. Lead wires (not shown) may subsequently be attached to electrodes 15 and 25, and also to plugs 48 and 48′. Since the junction between body 41 and plug 48 is rectifying, and the junction between body 41 and plug 48′ is similarly rectifying, in effect an array of rectifying diodes have been formed wherein each diode is in electrical contact with desired portions of the printed circuit 45.

*Example XV*

In this example, the principles of the invention are utilized to form an integrated solid state device. A device is formed in which a plurality of circuit functions are performed by means of controlled inhomogeneities within a single monolithic block of semiconductive material. The particular device illustrated in this example may be utilized as a computer sub-assembly, and is of the type known as a 5-input OR gate.

Integrated device 50 as illustrated in FIGURE 5a of this example is formed from a single block 51 of given conductivity type semiconductive crystalline material having two opposing major faces, and an insulating layer 52 on one major face thereof. In this example, the semiconductive body or wafer 51 consists of N-conductivity type monocrystalline silicon. The insulating layer 52 on one major wafer face may for example consist of materials such as silicon monoxide, silicon dioxide, magnesium fluoride, and the like.

Two separate conductive paths 54 and 56 are formed on the one major wafer face over the insulating layer 52. The conductive paths 54 and 56 suitably consist of a conductive metal such as silver, palladium, or the like. These may be deposited by evaporation, or by other convenient techniques known to the art. Between the conductive paths or zones 54 and 56 on the one major wafer face there is deposited a zone 55 of electrically resistive material such as deflocculated graphite or the like, by any suitable known method.

A set of 5 ohmic contacts (58, 58′, 58″, 58‴, and 58⁗) is then formed in one conductive zone 54. A set of ohmic contacts is formed by positioning the semiconductive silicon wafer 51 on a donor-containing metallic plate (not shown), which may, for example, consist of 99 weight percent lead and one weight percent of a donor such as antimony, and utilizing a pulsed electron beam to drill a set of 5 wells transversely through wafer 51 and partly into the aforesaid metallic plate so as to form a set of 5 metallic plugs within the silicon wafer. The technique has been described above in Example XV and illustrated in FIGURES 3a–3h. Since in this example the wafer 51 is N-type, the set of 5 donor-containing metallic plugs (58, 58′, 58″, 58‴ and 58⁗) constitute ohmic contacts to wafer 51. The ohmic contacts may also be fabricated by alloying a set of 5 donor-containing electrode pellets to the major face of the wafer 51 which is opposite the insulating layer 52. Alternatively, the ohmic contacts may be fabricated by depositing a suitable metal, for example lead, on desired portions of the silicon wafer 51. Masking and evaporation techniques or masking and plating techniques may be utilized for this purpose.

Next a set of 5 rectifying contacts (68, 68′, 68″, 68‴ and 68⁗) are formed to wafer 51. A connection to each rectifying contact 68, 68′, 68″, 68‴ and 68⁗, is made by means of a conductive path 78, 78′, 78″, 78‴ and 78⁗ respecively. The conductive paths in this example consist of silver evaporated on selected portions of insulating layer 52.

In this example, the set of 5 rectifying contacts (68, 68′, 68″, 68‴ and 68⁗) is formed by positioning plate 51 on an aluminum plate (not shown). A pulsed electron beam is then utilized to drill a set of 5 wells transversely through the wafer 51 and partly through the aluminum plate so as to form an aluminum plug in each well. Since the silicon wafer 51 of this example is N-type, the set of aluminum plugs thus introduced into the wafer form rectifying contacts to the wafer. The technique of utilizing first one metal plate containing donor material, and then another metal plate containing acceptor material, so as to form one set of ohmic contacts and one set of rectifying contacts to the same wafer, is similar to that described above in Example XV and illustrated in FIGURES 3a–3h.

The set of 5 rectifying contacts is formed in a portion of the wafer 51 adjacent the conductive zone 54, which contains a set of ohmic contacts, but on that side of zone 54 which is opposite the resistive strip 55. The spacing between the set of ohmic contacts (58, 58′, 58″, 58‴, 58⁗) and the set of rectifying contacts (68, 68′, 68″, 68‴, 68⁗) is adjusted in accordance with the resistivity of wafer 51, so that between contacts 58 and 68 there is a predetermined value of resistance $R_{01}$ due to the resistivity and thickness of the wafer material between these two contacts. Similarly there are resistance values $R_{02}$, $R_{03}$, $R_{04}$, and $R_{05}$ between contacts 58′ and 68′, 58″ and 68″, 58‴ and 68‴, and 58⁗ and 68⁗ respectively.

A simplified equivalent circuit of the device of FIGURE 5a is shown in FIGURE 5b. If a pulse is applied at one or more of the 5 input terminals $e_1$, $e_2$, $e_3$, $e_4$, and $e_5$, then an output pulse will appear across the output terminals $e_0$. In this device, the input pulses must be positive with respect to ground. It will be understood that this example is but illustrative, and various types of other sub-assemblies such as AND gates may be fabricated utilizing the principles of the invention.

Variations may be made in the above examples without departing from the spirit and scope of the invention. For example, in the embodiment illustrated in FIGURES 4a–4e the metallic plate 40 utilized may induce the same conductivity type as that of semiconductor wafer 41, so that metallic plugs 48 and 48′ form ohmic contacts to wafer 41, while the electrode pellets 15 and 25 may contain a substance which conduces opposite conductivity type in wafer 41, so that electrodes 15 and 25 form rectifying contacts to wafer 41. As mentioned above, the semiconductive wafers utilized may be very lightly doped or intrinsic in character. Another modification is to utilize semiconductive wafers which are heavily doped to the point of degeneracy, for example, containing about $10^{20}$ charge carriers per $cm.^2$. Under these conditions the formation of PN junctions in the wafer will result in tunnel diodes and tunnel rectifiers.

There have been thus described improved semiconductor devices and improved methods of fabricating them.

What is claimed is:

1. The method of fabricating an electrical contact to a semiconductive wafer, comprising the steps of positioning said wafer upon a metallic plate; utilizing an electron beam to drill a well transversely through said wafer and partly through said plate to vaporize a portion of said wafer and melt a portion of said plate so that the molten portion rises within said well; and cooling said molten portion to solidify said molten portion within said well in said wafer.

2. The method of fabricating an electrical contact to a semiconductive crystalline wafer comprising the steps of positioning said wafer upon a metallic plate; utilizing an electron beam to drill a well transversely through said wafer and partly through said plate to vaporize a portion of said wafer and melt a portion of said plate so that the molten portion of said plate rises within said well; cooling said molten portion to solidify said molten portion within said well in said wafer; and subsequently reheating the assemblage of said semiconductive wafer and said metallic plate to a temperature less than the melting point of said wafer and less than the melting point of said plate but sufficient to alloy said solidified portion to said wafer.

3. The method of fabricating an electrical contact to a semiconductive monocrystalline wafer, comprising the steps of positioning said wafer upon a metallic plate; utilizing a pulsed electron beam to drill a well no greater than 3 mils in diameter transversely through said wafer and partly through said plate to vaporize a portion of said wafer and melt a portion of said plate so that the molten portion of said plate rises within said well; and cooling said molten portion to solidify said molten portion as a metallic plug within said well in said semiconductive wafer.

4. The method of fabricating a rectifying contact to a given conductivity type crystalline semiconductive wafer, comprising the steps of positioning said wafer upon a metallic plate, said plate including at least one substance capable of imparting opposite type conductivity to said semiconductive wafer; utilizing a pulsed electron beam to drill a well transversely through said wafer and partly through said plate to vaporize a portion of said wafer and melt a portion of said plate so that the molten portion of said plate rises within said well; cooling said molten portion to solidify said molten portion within said well in said semiconductive wafer; and removing said wafer from said plate.

5. The method of fabricating a rectifying contact to a given conductivity type crystalline semiconductive wafer, comprising the steps of positioning said wafer upon a metallic plate, said plate including at least one substance capable of imparting opposite type conductivity to said semiconductive wafer; utilizing a plurality of discrete electron beam pulses, each said pulse being about 5–25 microseconds in duration, the interval between said pulses being at least 50 milliseconds, to drill a well transversely through said wafer and partly through said plate to vaporize a portion of said wafer and melt a portion of said plate so that the molten portion of said plate rises within said well; cooling said molten portion to solidify said molten portion within said well in said semi-conductive wafer; and removing said wafer from said plate.

6. The method of fabricating a rectifying contact to a given conductivity type crystalline semiconductive wafer, comprising the steps of positioning said wafer upon a metallic plate, said plate including at least one substance capable of imparting opposite type conductivity to said semiconductive wafer; utilizing a pulsed electron beam to drill a well transversely through said wafer and partly through said plate to vaporize a portion of said wafer and melt a portion of said plate so that the molten portion of said plate rises within said well; cooling said molten portion to solidify said molten portion within said well in said semiconductive wafer; removing said wafer from said plate; and subsequently heating said wafer to a temperature below the melting point of said wafer but sufficient to alloy said solidified portion of said plate to said wafer.

7. The method of fabricating a rectifying contact to a given conductivity type crystalline semiconductive wafer, comprising the steps of positioning said wafer upon a metallic plate, said plate including at least one substance capable of imparting opposite type conductivity to said semiconductive wafer; utilizing a pulsed electron beam to drill a well not greater than 3 mils in diameter transversely through said wafer and partly through said plate to vaporize a portion of said wafer and melt a portion of said plate so that the molten portion of said plate rises within said well; cooling said molten portion to solidify said molten portion within said well in said semiconductive wafer; and removing said wafer from said plate.

8. The method of fabricating an ohmic contact to a given conductivity type semiconductive crystalline wafer, comprising the steps of positioning said wafer upon a metallic plate, said plate including at least one substance capable of imparting said given conductivity type to said semiconductive wafer; utilizing a pulsed electron beam to drill a well not greater than 3 mils in diameter transversely through said semiconductive wafer and partly through said plate to vaporize a portion of said wafer and melt a portion of said plate so that the molten portion of said plate rises within said well; and cooling said molten portion to solidify said molten portion within said well in said semiconductive wafer.

9. The method of fabricating an ohmic contact to a given conductivity type semiconductive crystalline wafer, comprising the steps of positioning said wafer upon a metallic plate, said plate including at least one substance capable of imparting said given conductivity type to said semiconductive wafer; utilizing a pulsed electron beam to drill a well not greater than 3 mils in diameter transversely through said semiconductive wafer and partly through said plate to vaporize a portion of said wafer and melt a portion of said plate so that the molten portion of said plate rises within said well; cooling said molten portion to solidify said molten portion within said well in said semiconductive wafer; removing said wafer from said plate; and heating said wafer to a temperature below the melting point of said wafer but sufficient to alloy said portion of said plate in said well to said wafer.

10. The method of fabricating a semiconductor device comprising the steps of positioning a given conductivity type crystalline semiconductive wafer upon a first metallic plate, said first plate including at least one substance capable of imparting opposite type conductivity to said wafer; forming a plurality of rectifying contacts to said wafer by utilizing a pulsed electron beam to drill a first set of wells transversely through said wafer and partly through said first plate to vaporize a portion of said wafer and melt a portion of said first plate so that the molten portions of said first plate rise within each said well of said first set; cooling said molten portions to solidify said molten portions of said first plate within each said well of said first set in said wafer; removing said wafer from said first metallic plate; positioning said wafer upon a second metallic plate, said second plate including at least one substance capable of imparting said given conductivity type to said wafer; forming a plurality of ohmic contacts to said wafer by utilizing a pulsed electron beam to drill a second set of wells transversely through said wafer and partly through said second plate to vaporize a portion of said wafer and melt a portion of said second plate such that the molten portions of said second plate rise within each said well of said second set; cooling said molten portions of said second plate to solidify said molten portions of said second plate within each said well of said second set in said wafer; and removing said wafer from said second plate.

References Cited by the Examiner

UNITED STATES PATENTS

| | | | |
|---|---|---|---|
| 2,714,183 | 7/55 | Bruch | 317—235 |
| 2,793,281 | 5/57 | Steigerwald | 75—65 |
| 2,860,251 | 11/58 | Pakswer et al. | 75—65 |
| 2,883,544 | 4/59 | Robinson | 75—65 |
| 2,919,388 | 12/59 | Ross | 317—235 |
| 3,033,974 | 5/62 | Schleich et al. | 75—65 |
| 3,067,485 | 12/62 | Ciccolella et al. | 29—25.3 |
| 3,076,253 | 2/63 | Cornelison et al. | 29—25.3 |

DAVID L. RECK, *Primary Examiner.*

JAMES D. KALLAM, HYLAND BIZOT, *Examiners.*